US012568826B2

(12) United States Patent
Okada

(10) Patent No.: US 12,568,826 B2
(45) Date of Patent: Mar. 3, 2026

(54) SEMICONDUCTOR DEVICE AND METHOD FOR MANUFACTURING SEMICONDUCTOR DEVICE

(71) Applicant: Kioxia Corporation, Tokyo (JP)

(72) Inventor: Yoshiharu Okada, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 496 days.

(21) Appl. No.: 18/164,212

(22) Filed: Feb. 3, 2023

(65) Prior Publication Data

US 2024/0136306 A1     Apr. 25, 2024
US 2024/0234341 A9     Jul. 11, 2024

(30) Foreign Application Priority Data

Oct. 25, 2022     (JP) ................................. 2022-170240

(51) Int. Cl.
*H01L 23/00*          (2006.01)
*H10B 80/00*          (2023.01)
(52) U.S. Cl.
CPC ........... *H01L 23/562* (2013.01); *H10B 80/00* (2023.02)
(58) Field of Classification Search
CPC ... H01L 23/562; H01L 21/6836; H01L 25/18; H01L 25/50; H10B 80/00
See application file for complete search history.

(56) References Cited

U.S. PATENT DOCUMENTS

| | | | |
|---|---|---|---|
| 8,755,233 B2 | 6/2014 | Nagashima | |
| 9,024,424 B2 | 5/2015 | Yoshimura et al. | |
| 2004/0026774 A1 | 2/2004 | Corisis et al. | |
| 2009/0243065 A1 | 10/2009 | Sugino et al. | |
| 2021/0082895 A1 | 3/2021 | Miura | |
| 2022/0093568 A1* | 3/2022 | Hu ....................... H01L 25/0657 | |
| 2023/0101826 A1* | 3/2023 | Huang .................. H01L 21/565 257/777 |
| 2023/0122804 A1* | 4/2023 | Kim .................. H01L 23/49822 257/659 |
| 2024/0063106 A1* | 2/2024 | Lee ......................... H01L 23/13 |
| 2024/0088199 A1* | 3/2024 | Marin ................... H01F 27/292 |
| 2024/0429188 A1* | 12/2024 | Tanaka .................... H01L 24/16 |

FOREIGN PATENT DOCUMENTS

| | | | |
|---|---|---|---|
| JP | 2006-216691 A | 8/2006 | |
| JP | 2010-199611 A | 9/2010 | |
| JP | 2012-119481 A | 6/2012 | |
| JP | 5364750 B2 | 12/2013 | |
| JP | 2021-048195 A | 3/2021 | |
| WO | WO-2011/021364 A1 | 2/2011 | |

* cited by examiner

*Primary Examiner* — Thao P Le
(74) *Attorney, Agent, or Firm* — Foley & Lardner LLP

(57)          ABSTRACT
A semiconductor device includes a substrate, a spacer, and a first member. The spacer is disposed on the substrate, and has (i) a first surface facing the substrate, (ii) a second surface opposite to the first surface, and (iii) a third surface, at least part of the third surface forming an angle of less than 90 degrees with respect to the second surface. The first member is disposed on the substrate and, when viewed in a first direction from the substrate toward the spacer, at least partly overlaps the spacer. The first member is not in contact with the spacer.

15 Claims, 18 Drawing Sheets

SEMICONDUCTOR DEVICE AND METHOD FOR MANUFACTURING SEMICONDUCTOR DEVICE

CROSS-REFERENCE TO RELATED APPLICATION(S)

This application is based upon and claims the benefit of priority from Japanese Patent Application No. 2022-170240, filed Oct. 25, 2022, the entire contents of which are incorporated herein by reference.

FIELD

Embodiments described herein relate generally to a semiconductor device and a method for manufacturing the semiconductor device.

BACKGROUND

In some semiconductor devices, a semiconductor chip and a spacer are provided on the main surface of a substrate, and a plurality of other semiconductor chips are provided above the spacer.

DETAILED DESCRIPTION

Figures 1, 2:
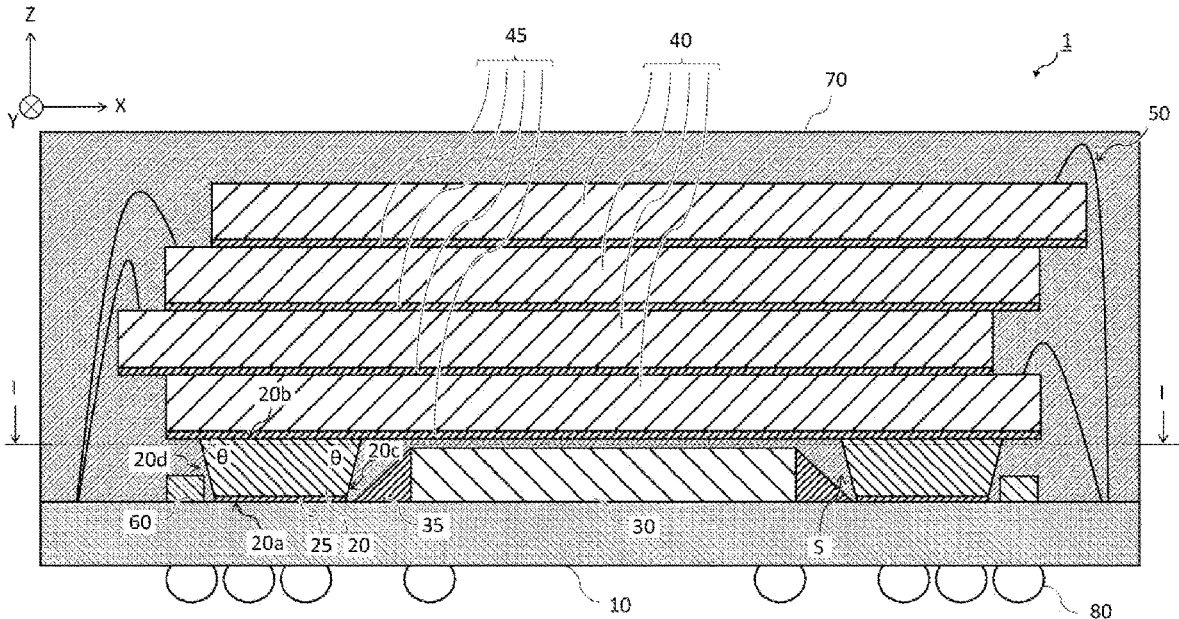
FIG. 1 is a plan view of a semiconductor device according to a first embodiment.
FIG. 2 is a cross-sectional view of the semiconductor device according to the first embodiment taken along line II-II of FIG. 1.

Embodiments provide a semiconductor device which can enhance the degree of freedom of arrangement on a substrate.

In general, according to at least one embodiment, a semiconductor device includes a substrate, a spacer, and a first member. The spacer is disposed on the substrate, and has (i) a first surface facing the substrate, (ii) a second surface opposite to the first surface, and a (iii) third surface, at least part of the third surface forming an angle of less than 90 degrees with respect to the second surface. The first member is disposed on the substrate and, when viewed in a first direction from the substrate toward the spacer, at least partly overlaps the spacer. The first member is not in contact with the spacer.

According to at least one embodiment, a method for manufacturing a semiconductor device includes the steps of: dicing a spacer at a first angle of inclination, the first angle being 0 degrees or more and less than 90 degrees, with respect to a first direction; further dicing the spacer at a second angle of inclination, the second angle being 0 degrees or more and less than 90 degrees, with respect to the first direction; and disposing, after dicing the spacer at a position on a substrate where at least part of the spacer overlaps a first member disposed on the substrate when viewed in the first direction, and wherein the spacer is not in contact with the first member.

Embodiments of the present disclosure will now be described with reference to the drawings. The drawings are schematic; thus, a relationship between a thickness and in-plane dimensions, a thickness ratio between layers, etc. may not be to scale. In the drawings and the description below, the same symbols are used for substantially the same components or elements, and a description there is omitted.

X direction and Y direction are directions along the main surface of the below-described substrate 10. The Y direction is a direction intersecting the X direction. Z direction is a direction intersecting the X direction and the Y direction, and is the thickness direction of the substrate 10. The Z direction herein corresponds to a direction perpendicular to the main surface of the substrate 10. The Z direction is an example of a "first direction". The X direction is an example of a "second direction". The Y direction is an example of a "third direction". The following description is given with reference to a cross-sectional view of a semiconductor device 1 in an XZ plane. The semiconductor device 1 has substantially the same configuration in a cross-sectional view thereof in a YZ plane. Therefore, a description of a cross-sectional view of the semiconductor device 1 in a YZ plane will be omitted.

First Embodiment

As shown in FIGS. 1 and 2, the semiconductor device 1 according to at least one embodiment includes a substrate 10, spacers 20, a semiconductor chip 30, semiconductor chips 40, bonding wires 50, components 60, a sealing resin 70, and external electrodes 80.

The spacers 20, the semiconductor chip 30, and the components 60 are provided on the substrate 10. The surface on which the spacers 20, the semiconductor chip 30, and the components 60 are provided is referred to as the main surface of the substrate 10. The external electrodes 80 are provided on the opposite surface of the substrate 10, on which the spacer 20, the semiconductor chip 30 and the components 60 are provided, to the main surface. The surface of the substrate 10 on which the external electrodes 80 are provided is referred to as the back surface of the substrate 10. The substrate 10 is, for example, a printed circuit board and other wiring boards.

The spacers 20 each include an adhesive layer 25. Each spacer 20 is bonded to the substrate 10 by the adhesive layer 25. The spacers 20 are provided around the semiconductor chip 30 as shown in FIG. 1. In this embodiment, a total of four spacers 20 are provided: two spacers 20x lie side-by-side with the semiconductor chip 30 in the X direction, and two spacers 20y lie side-by-side with the semiconductor chip 30 in the Y direction. The number of spacers 20 is not limited to four; at least one spacer 20 may be provided around the semiconductor chip 30. The spacers 20 may comprise, for example, a resin, silicon, a ceramic, or a metal. In at least one embodiment, each spacers 20 is a silicon. The adhesive layer 25 is, for example, a DAF (Die Attach Film).

Each spacer 20 has a first surface 20a, a second surface 20b, a third surface 20c and a fourth surface 20d. The first surface 20a is a surface which is in contact with the adhesive layer 25 and which faces the substrate 10. The second surface 20b is a surface opposite to the first surface 20a. The second surface 20b is larger than the first surface 20a. In other words, the first surface 20a is smaller than the second surface 20b. The first surface 20a is substantially parallel to the second surface 20b. The third surface 20c is a surface which is in contact with the first surface 20a and the second surface 20b. The third surface 20c extends in the Z direction. The fourth surface 20d is a surface which is in contact with the first surface 20a and the second surface 20b and which faces the third surface 20c. The fourth surface 20d is farther from the semiconductor chip 30 than the third surface 20c in the X direction. The fourth surface 20d extends in the Z direction. The angle θ between the third surface 20c and the second surface 20b is more than 0 degrees and less than 90 degrees. The angle θ between the fourth surface 20d and the second surface 20b is more than 0 degrees and less than 90 degrees. It is preferred that the angle θ is not less than 30 degrees and less than 90 degrees. By setting the angle θ to not less than 30 degrees, it is possible to reduce the possibility of chipping of the corners of the spacer 20. The angle θ is less than 90 degrees, but preferably less than 80 degrees and less than 70 degrees. It is more preferred that the angle θ is not less than 30 degrees and not more than 60 degrees. By setting the angle θ to not more than 60 degrees, the first surface 20a can be made further smaller than the second surface 20b. Thus, in this embodiment, when viewed in the Y direction, the spacer 20 has a trapezoidal shape, with the third surface 20c and the fourth surface 20d being inclined.

The semiconductor chip 30 is, for example, a controller chip, and is hereinafter referred to as the controller 30. The controller 30 is provided on the substrate 10. The controller 30 controls the semiconductor chips 40. In this embodiment, the elements of the controller 30 are provided, for example, on the surface facing the substrate 10. Thus, the controller 30 is flip-chip mounted on the substrate 10. Further, as shown in FIG. 2, the controller 30 is further fixed on the substrate 10 by, for example, a resin 35 as a first member. The flip-chip can be done by either the side-fill method, in which resin is filled after the electrode on the underside of the semiconductor chip is connected to the substrate, or the method in which resin material is supplied to at least one of the substrate or the semiconductor chip first and then the semiconductor chip is connected to the substrate. In this embodiment, the resin 35 is a fillet and bleed of a resin that seals a mounted component or a connecting component. The resin 35 is, for example, a UF (Under Fill), an NCP (Non-Conductive Paste), or an NCF (Non-Conductive Film). At least part of the resin 35 is provided between the substrate 10 and each spacer 20 in the Z direction. In this embodiment, at least part of the resin 35, provided on the third surface 20c side of the spacer 20, is provided between the substrate 10 and the spacer 20 in the Z direction. Thus, at least part of the resin 35 overlaps the spacer 20 when viewed in the Z direction. The resin 35 is provided between the spacer 20 and the controller 30 in the X direction. The resin 35 is electrically independent of the spacer 20, or is not in direct contact with the spacer 20. It is to be noted that the resin 35 as a first member may not be used. The first member is not limited to the resin 35, and may be a mounted component including a capacitor, or a connecting component including a metal wire. For example, when the controller 30 and the substrate 10 are electrically connected using a bonding wire, the bonding wire is the first member. In this embodiment, the resin 35 is an example of a first resin.

The semiconductor chips 40 are provided above the spacers 20. Though four semiconductor chips 40 are stacked in the Z direction in this embodiment, at least one semiconductor chip 40 may be provided above the spacers 20. Each semiconductor chip 40 includes an adhesive layer 45. Each semiconductor chip 40 is bonded by the adhesive layer 45 to the spacers 20 or to a semiconductor chip 40 located below in the Z direction. The adhesive layer 45 can not only bond a semiconductor chip 40 to the spacers 20 or to another semiconductor chip 40 located below in the Z direction, but can also reduce a stress applied to the semiconductor chips 40 upon bonding. The larger the thickness of the adhesive layer 45, the more the stress can be reduced. On the other hand, the larger the thickness of the adhesive layer 45, the larger may be the thickness of the semiconductor device 1. In this embodiment, the semiconductor chips 40 are electrically connected to the substrate 10 and the controller 30 using, for example, bonding wires 50. The semiconductor chips 40 are, for example, NAND flash memory chips.

Each component 60 as a first member is, for example, a mounted component including a capacitor, a connecting component including a metal wire, or a fillet and bleed of a resin that seals a mounted component or a connecting component. At least part of each component 60 is provided between the substrate 10 and a spacer 20 in the Z direction. In this embodiment, at least part of the component 60, provided on the fourth surface 20d side of a spacer 20, is provided between the substrate 10 and the spacer 20 in the Z direction. Thus, at least part of the component 60 overlaps the spacer 20 when viewed in the Z direction. The spacer 20 is provided between the component 60 and the controller 30 in the X direction. The component 60 is electrically independent of the spacer 20, or is not in direct contact with the spacer 20. It is to be noted that the components 60 as first members may not be used. While two components 60 are illustrated in FIG. 1, the arrangement and number of components 60 are not limited to the illustrated ones.

The sealing resin 70 seals the substrate 10, the spacers 20, the controller 30, the semiconductor chips 40, the bonding wires 50, the components 60, etc. As shown in FIG. 2, the sealing resin 70 also fills the space S surrounded by the substrate 10, the spacers 20, the controller 30, and the lowermost semiconductor chip 40. The sealing resin 70 comprises, for example, an epoxy resin. The sealing resin 70 may be, for example, MUF (Mold Under Fill). In this embodiment, the sealing resin 70 is an example of a second resin.

The external electrodes 80 are provided on the back surface of the substrate 10. Each external electrode 80 is partly exposed and can be electrically connected to the outside of the semiconductor device 1.

Figure 3:
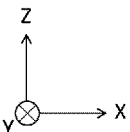
FIG. 3 is a process diagram illustrating a method for manufacturing a spacer according to the first embodiment.
Figure 3:
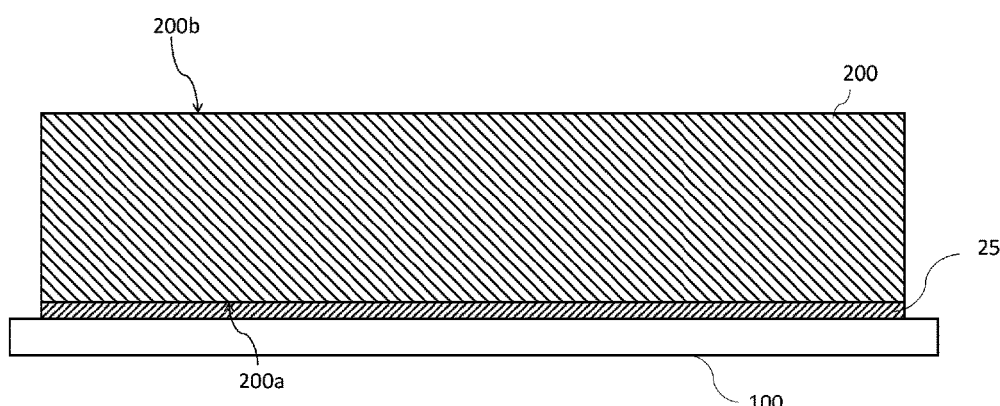

A method for manufacturing the spacer 20 according to this embodiment will be described with reference to FIGS. 3 through 5. The illustrated spacer 200 includes a main surface 200a and a back surface 200b opposite to the main surface 200a. In this embodiment, the spacer 200 is a silicon wafer. The spacer 200 may be made of the same material as the spacer 20. Thus, the spacer 200 comprises, for example, a third resin, silicon, a ceramic, or a metal. The third resin may be the same as the first or second resin. The third resin may be different from the first or second resin. An adhesive layer 25 is provided on the main surface 200a of the spacer 200 and, as shown in FIG. 3, the spacer 200 is placed on a processing table 100 with the adhesive layer 25 in contact with the processing table 100. It is also possible to provide the adhesive layer 25 on the processing table 100 in advance, and place the spacer 200 on the processing table 100 such that the main surface 200a of the spacer 200 comes into contact with the adhesive layer 25.

Figure 4:
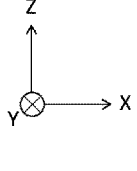
FIG. 4 is a process diagram illustrating the method for manufacturing the spacer according to the first embodiment.
Figure 4:
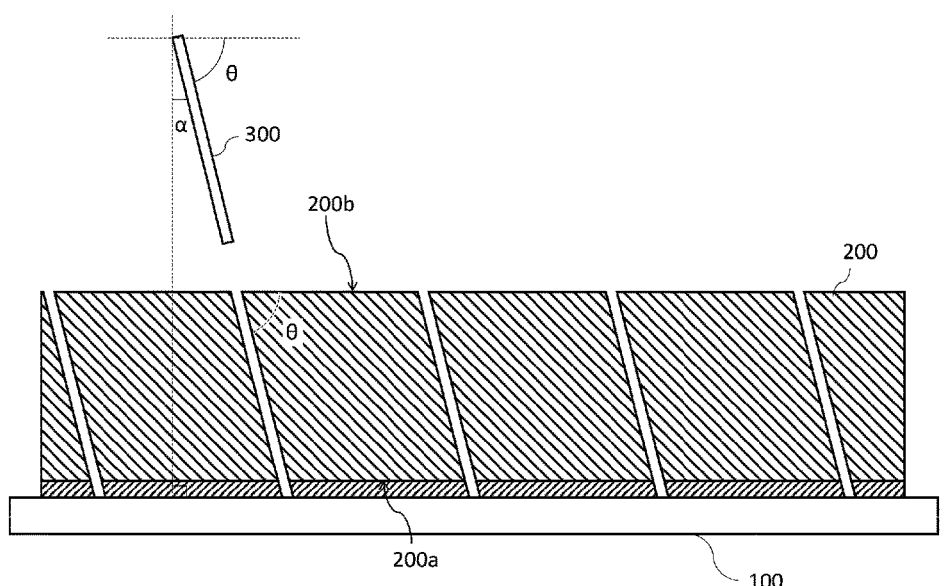
Figure 5:
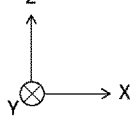
FIG. 5 is a process diagram illustrating the method for manufacturing the spacer according to the first embodiment.

As shown in FIG. 4, the spacer 200 is diced by a blade 300 inclined at an angle α. Subsequently, as shown in FIG. 5, the spacer 200 is diced by the blade 300 inclined at an angle −α, thereby completing manufacturing of spacers 20. The order of the above process steps may be reversed: the step of FIG. 4 may be performed after the step of FIG. 5.

The angle θ formed between the third surface 20c and the second surface 20b and the angle θ formed between the fourth surface 20d and the second surface 20b are determined by the following equation: θ=90−α (1), where α represents the inclination angle of the blade 300. Thus, the angle θ formed between the third surface 20c or the fourth surface 20d and the second surface 20b changes with the inclination angle α of the blade 300. The angle α is more than 0 degrees and less than 90 degrees. The angle α is preferably more than 0 degrees and not more than 60 degrees. The angle α is more preferably not less than 30 degrees and not more than 60 degrees. The angles α and θ may be angles that take into consideration an inclination error of the blades 300 in the manufacturing process of the spacer 20. In particular, when the inclination angle α of the blade 300 is not less than 0 degrees and not more than 5 degrees, it is regarded as a manufacturing error, and the angle α is assumed to be approximately 0 degrees. Therefore, in such a case, "the angle θ is more than 0 degrees and less than 90 degrees" means that the angle θ is actually more than 0 degrees and less than 85 degrees.

Figure 6:
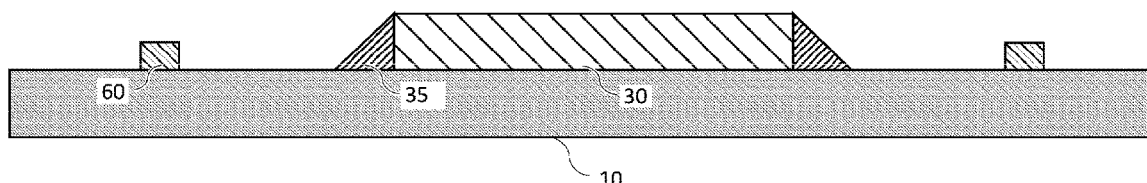
FIG. 6 is a process diagram illustrating a method for manufacturing the semiconductor device according to the first embodiment.
Figure 7:
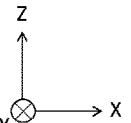
FIG. 7 is a process diagram illustrating the method for manufacturing the semiconductor device according to the first embodiment.
Figure 7:
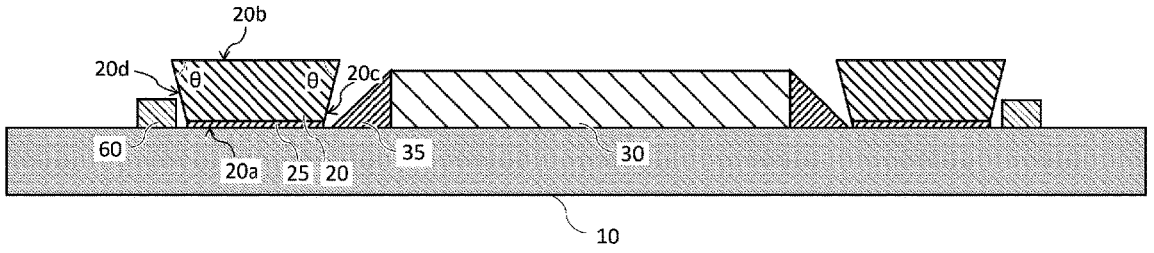
Figure 8:
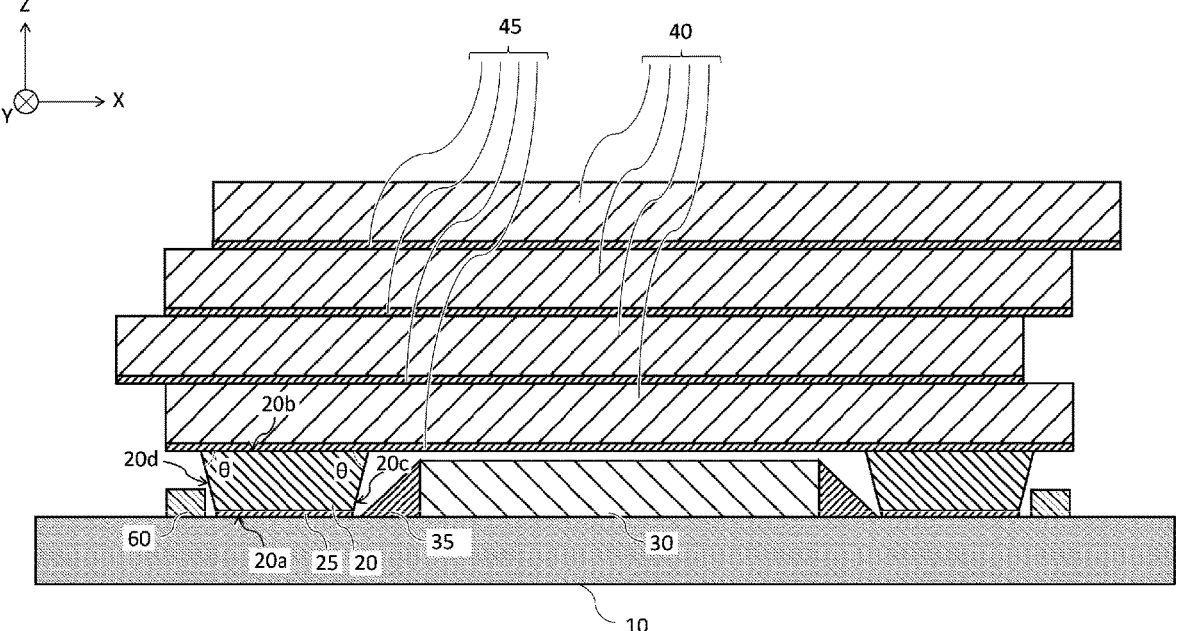
FIG. 8 is a process diagram illustrating the method for manufacturing the semiconductor device according to the first embodiment.

A method for manufacturing the semiconductor device 1 according to this embodiment will now be described with reference to FIGS. 6 through 9. As shown in FIG. 6, a controller 30 and components 60 are provided on a substrate 10. The controller 30 is fixed to the substrate 10 by a resin 35. Subsequently, as shown in FIG. 7, spacers 20 are provided on the substrate 10. For example, an adhesive layer 25 on the first surface 20a of each spacer 20 is pressed against the substrate 10 to bond the spacer 20 and the substrate 10 together, whereby the spacer 20 is provided above at least a part of a component 60 in the Z direction. As shown in FIG. 8, a plurality of semiconductor chips 40 are provided above the spacers 20. For example, the adhesive layer 45 of a semiconductor chip 40 is pressed against a spacer 20 or a semiconductor chip 40 located below in the Z direction to bond the semiconductor chip 40 to the spacer 20 or the semiconductor chip 40 located below in the Z direction.

Figure 9:
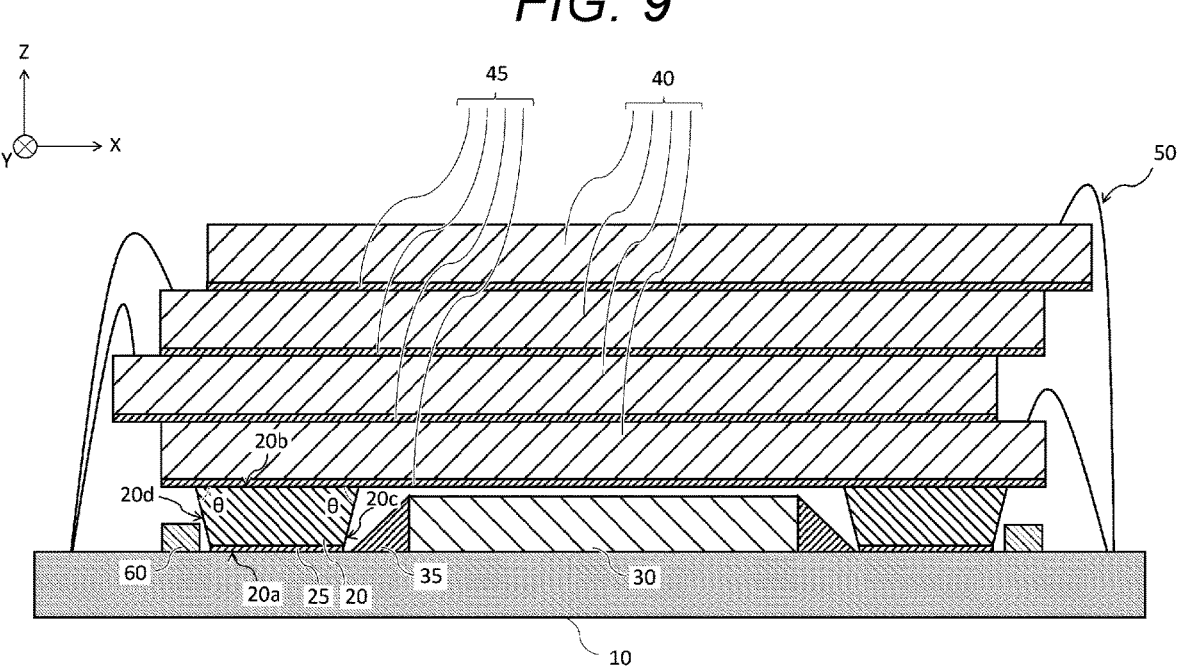
FIG. 9 is a process diagram illustrating the method for manufacturing the semiconductor device according to the first embodiment.

Then, as shown in FIG. 9, the semiconductor chips 40 are electrically connected to the substrate 10 using bonding wires 50. Thereafter, the spacers 20, the controller 30, the semiconductor chips 40, the bonding wires 50 and the components 60 on the main surface of the substrate 10 are sealed with a sealing resin 70. External electrodes 80 are bonded to the back surface of the substrate 10, thereby completing manufacturing of the semiconductor device 1 according to this embodiment shown in FIG. 2.

The order of the step of providing the semiconductor chips 40 and the step of electrically connecting the semiconductor chips 40 to the substrate 10 using the bonding wires 50 is not limited to the above-described one. In an example, after providing the lowermost semiconductor chip 40 above the spacers 20, the lowermost semiconductor chip 40 is electrically connected to the substrate 10 using bonding wires 50, and then the other semiconductor chips 40 are provided above the lowermost semiconductor chip 40.

According to this embodiment, the spacer 20 has a trapezoidal shape when viewed in the Y direction, with the third surface 20c and the fourth surface 20d being inclined. This makes it possible to enhance the degree of freedom of arrangement on the substrate 10, reduce the thickness of the semiconductor device 1, and increase the filling rate of the sealing resin 70.

In particular, by making the first surface 20a of the spacer 20 smaller than the second surface 20b, the spacer 20 can easily avoid contact with a first member facing the spacer 20 in the X direction. Thus, when viewed in the Z direction, the margin between the spacer 20 and the component 60 or the resin 35, which faces the spacer 20 in the X direction, can be reduced. Therefore, the degree of freedom of arrangement on the substrate 10 can be enhanced. For example, when the thickness of the spacer 20 is 50 μm and the inclination angle α of the blade 300 is 15 degrees (the angle θ between the third surface 20c and the second surface 20b is 75 degrees), the first surface 10a can be made smaller by about 26.8 um than the second surface 20b. It is also possible to make the substrate 10 itself smaller. Further, by making the second surface 20b of the spacer 20 larger than the first surface 20a, it is possible to reduce the stress on a semiconductor chip 40 when it is bonded to the spacer 20. Therefore, the thickness of the adhesive layer 45 can be reduced. In other words, it is possible to make semiconductor chip 40 thinner and still reduce the risk of cracks on the semiconductor chip 40. Furthermore, the space S is expanded by making the first surface 20a of the spacer 20 smaller than the second surface 20b. This makes it possible to increase the filling rate of the sealing resin 70.

Figure 10:
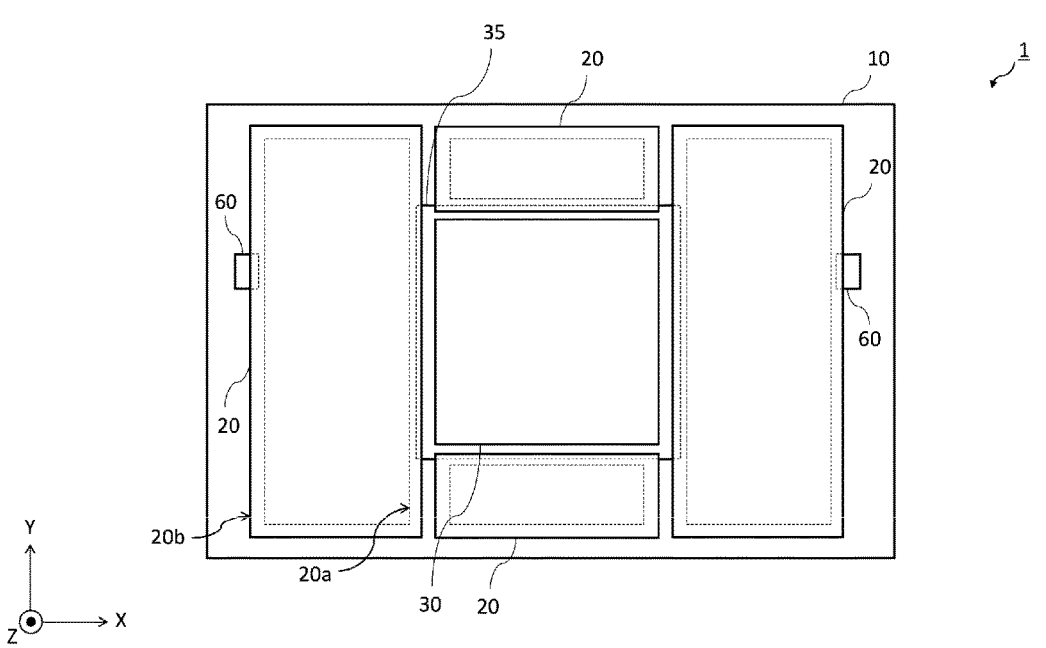
FIG. 10 is a plan view of a semiconductor device according to a modification of the first embodiment.

While the third surface 20c and the fourth surface 20d of the spacer 20 in the direction in which the controller 30 and the spacer 20 are arranged side-by-side have been described, the fifth and sixth surfaces of the spacer 20, which are each in contact with all of the first surface 20a to the fourth surface 20d of the spacer 20, may have the same configuration as shown in FIG. 10. Thus, when viewed in the Z direction, the four sides of the first surface 20a may be located nearer to the center of the spacer 20 than the four sides of the second surface 20b.

Figure 11:
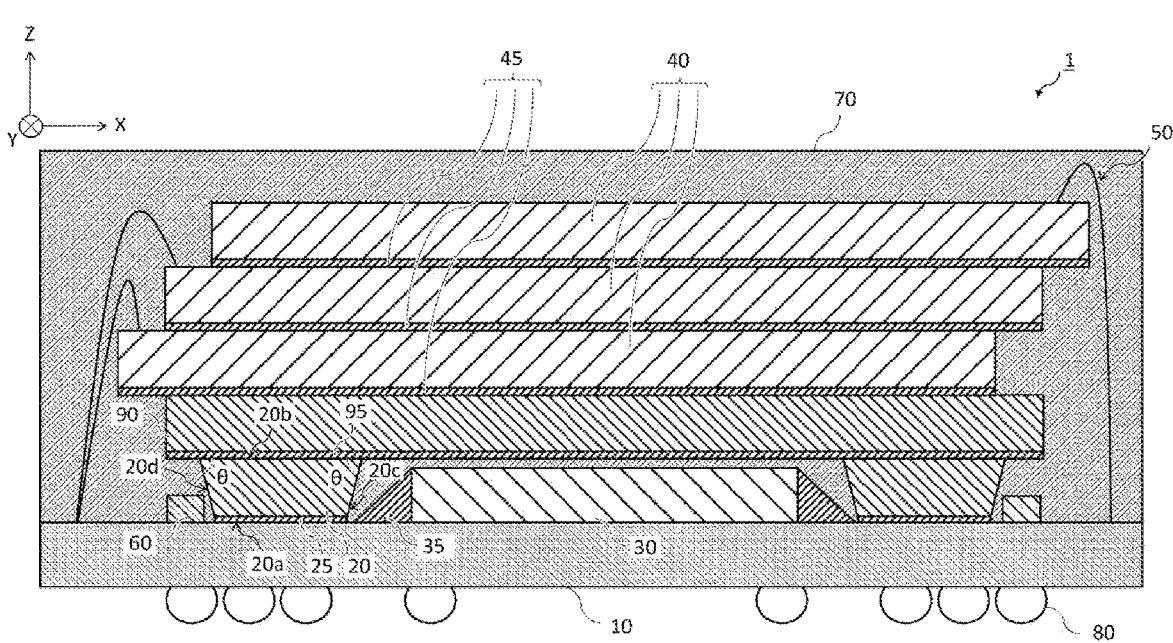
FIG. 11 is a cross-sectional view of the semiconductor device according to the modification of the first embodiment.

While the semiconductor device 1 in which the semiconductor chip 40 is provided on the spacers 20 has been described, the present disclosure is not limited to such an embodiment. For example, as shown in FIG. 11, a spacer 90 may be provided on the spacers 20. The spacer 90 includes an adhesive layer 95. The spacer 90 is provided on the spacers 20 via the adhesive layer 95. As with the adhesive layer 45, the adhesive layer 95 can not only bond the spacer 90 to the spacers 20, but can also reduce the stress applied to the spacer 90 upon bonding. The spacer 90 comprises, for example, a fourth resin, silicon, a ceramic, or a metal. The spacers 20 and the spacer 90 may be made of the same material or different materials.

Second Embodiment

A second embodiment differs from the first embodiment in the shape of the spacer 20 as viewed in the Y direction.

Figure 12:
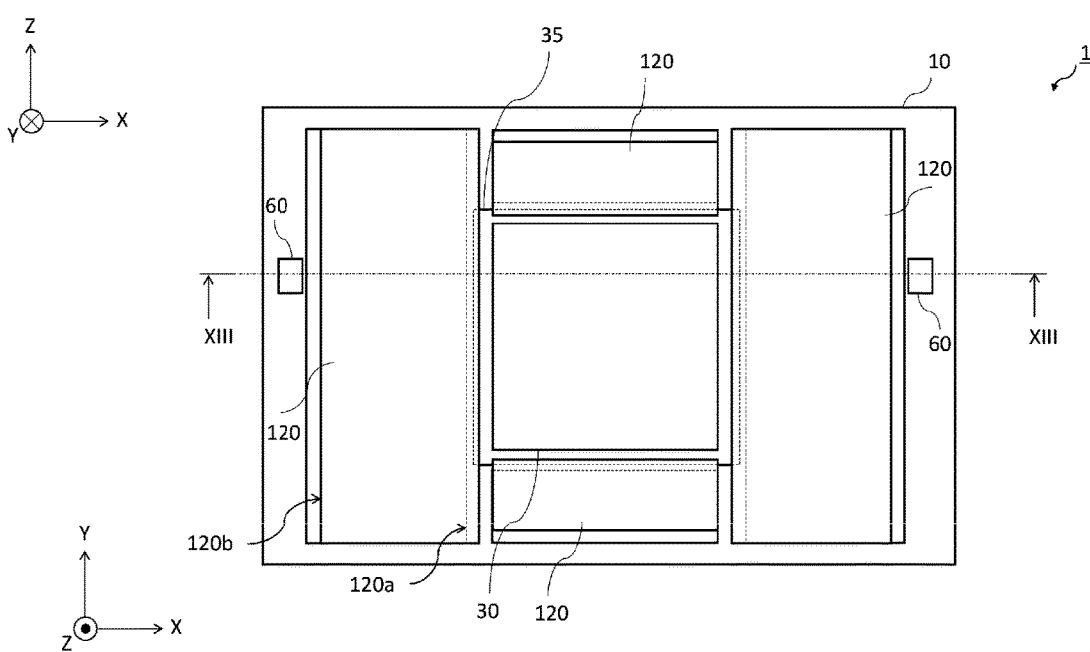
FIG. 12 is a plan view of a semiconductor device according to a second embodiment.
Figure 13:
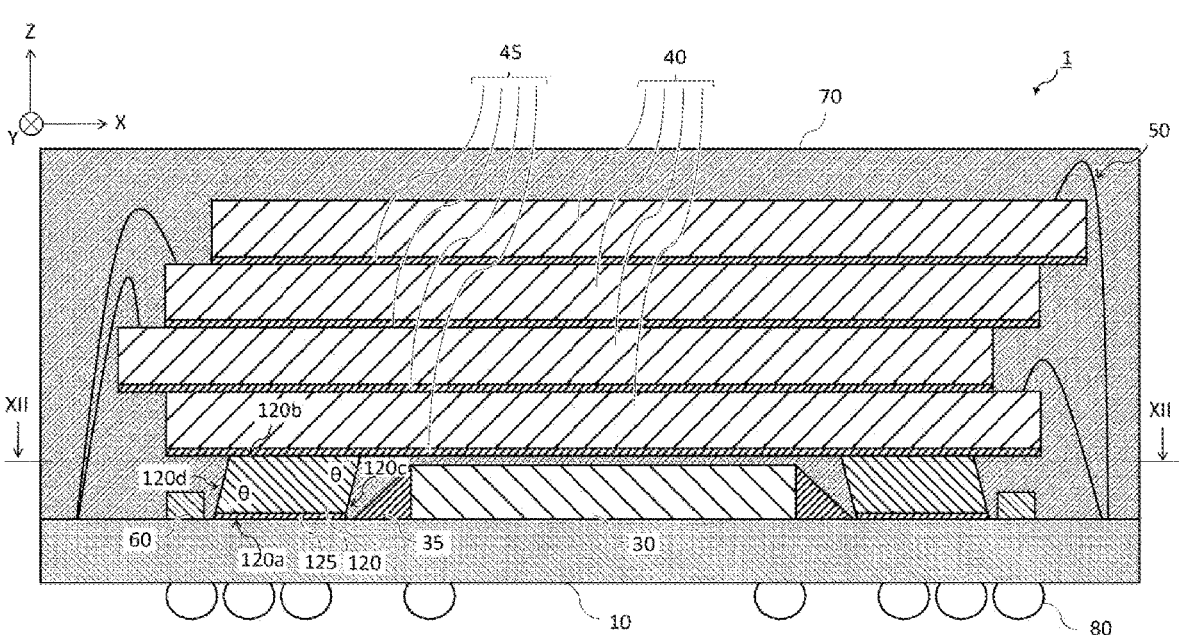
FIG. 13 is a cross-sectional view of the semiconductor device according to the second embodiment taken along line XIII-XIII of FIG. 12.

The configuration of a semiconductor device 1 according to this embodiment will be described with reference to FIGS. 12 and 13. In this embodiment, the semiconductor device 1 includes spacers 120 instead of the spacers 20. The basic configuration of each spacer 120 is the same as that of the spacer 20. However, the spacer 120 includes an adhesive layer 125 instead of the adhesive layer 25. Further, the spacer 120 includes a first surface 120a, a second surface 120b, a third surface 120c and a fourth surface 120d instead of the first surface 20a, the second surface 20b, the third surface 20c and the fourth surface 20d.

In this embodiment, the first surface 120a and the second surface 120b have substantially the same area. The fourth surface 120d is substantially parallel to the third surface 120c. The angle θ between the third surface 120c and the second surface 120b and the angle θ between the fourth surface 120d and the first surface 120a are each more than 0 degrees and less than 90 degrees. It is preferred that the angle θ is not less than 30 degrees and less than 90 degrees. Thus, in this embodiment, the spacer 120 has a parallelogram shape when viewed in the Y direction.

At least part of the resin 35 is provided between the substrate 10 and the spacer 120 in the Z direction. Thus, at least part of the resin 35 overlaps the spacer 120 when viewed in the Z direction.

A method for manufacturing the spacer 120 according to this embodiment is the same as the method described above with reference to FIGS. 3 and 4. Thus, the present method does not include the process step of FIG. 5; the number of process steps of the present method is smaller than that of the method for manufacturing the spacer 20 according to the first embodiment. A method for manufacturing the semiconductor device 1 according to this embodiment is the same as the method described above with reference to FIGS. 6 through 9.

According to this embodiment, the spacer 120 has a parallelogram shape when viewed in the Y direction. This makes it possible to enhance the degree of freedom of arrangement on the substrate 10 and to increase the filling rate of the sealing resin 70 as in the first embodiment. In particular, the spacer 120 can easily avoid contact with a first member provided beside the third surface 120c. Thus, when viewed in the Z direction, the margin between the spacer 120 and the resin 35 can be reduced. Further, compared to the first embodiment, the number of process steps for manufacturing the spacer 120 can be reduced.

Third Embodiment

Figure 14:
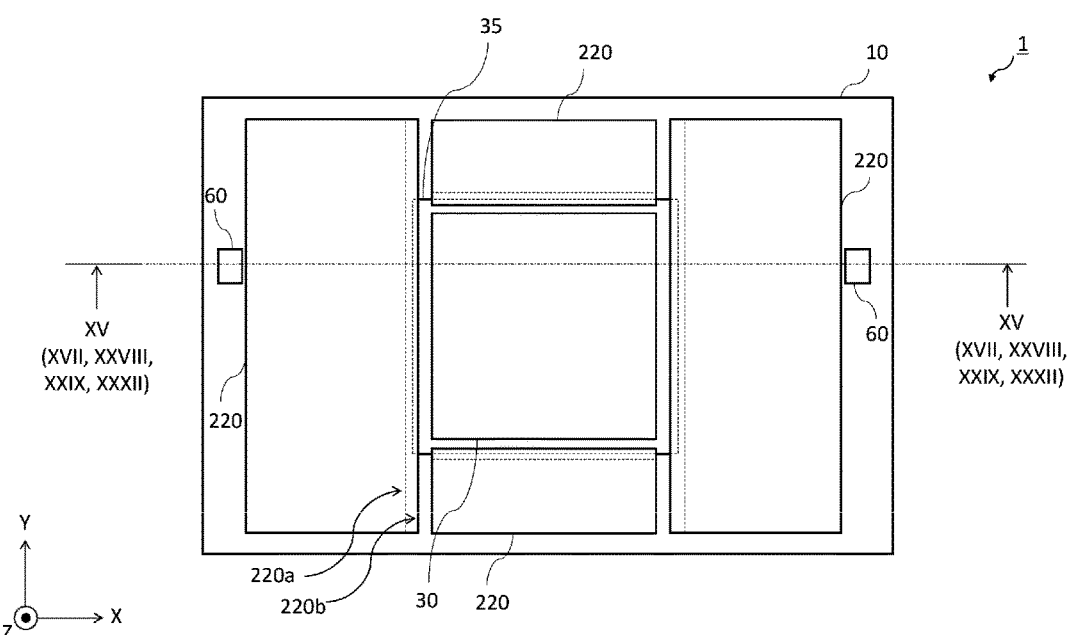
FIG. 14 is a plan view of a semiconductor device according to a third embodiment.
Figure 15:
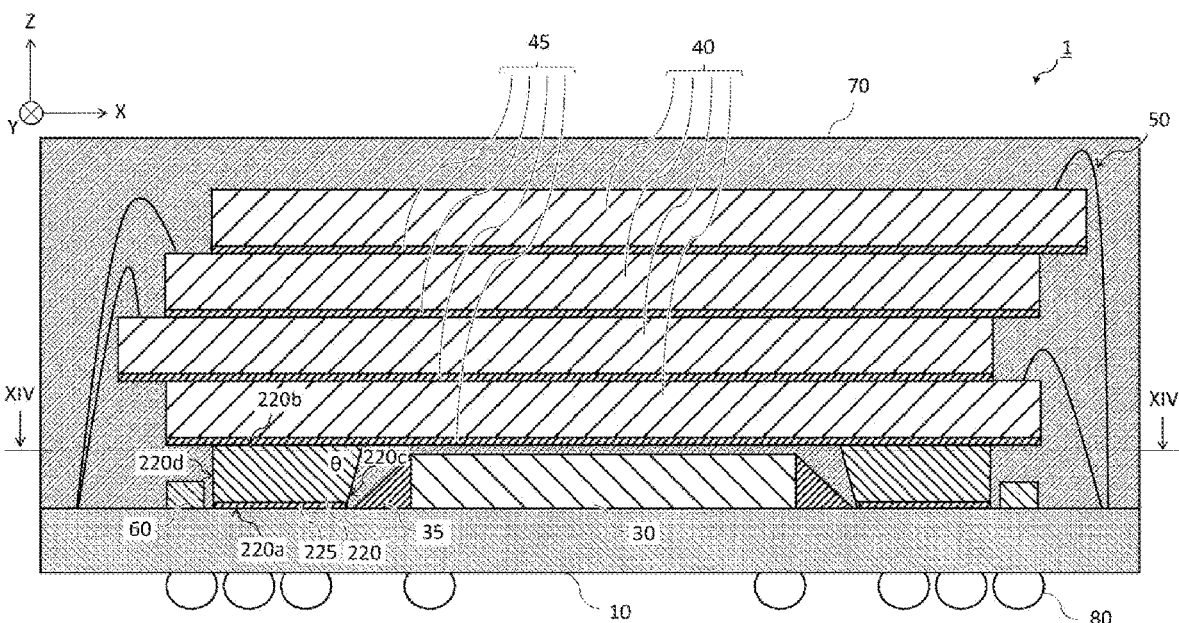
FIG. 15 is a cross-sectional view of the semiconductor device according to the third embodiment taken along line XV-XV of FIG. 14.

A third embodiment differs from the first embodiment in the shape of the spacer as viewed in the Y direction. The configuration of a semiconductor device 1 according to this embodiment will be described with reference to FIGS. 14 and 15. In this embodiment, the semiconductor device 1 includes spacers 220 instead of the spacers 20. The basic configuration of each spacer 220 is the same as that of the spacer 20. However, the spacer 220 includes an adhesive layer 225 instead of the adhesive layer 25. Further, the spacer 220 includes a first surface 220a, a second surface 220b, a third surface 220c and a fourth surface 220d instead of the first surface 20a, the second surface 20b, the third surface 20c and the fourth surface 20d.

In this embodiment, the angle θ between the third surface 220c and the second surface 220b is more than 0 degrees and less than 90 degrees. The angle between the fourth surface 220d and the first surface 220a is about 90 degrees. Thus, in this embodiment, when viewed in the Y direction, the spacer 220 has a trapezoidal shape, with the third surface 220*c* being inclined.

At least part of the resin 35 is provided between the substrate 10 and the spacer 220 in the Z direction. Thus, at least part of the resin 35 overlaps the spacer 220 when viewed in the Z direction.

Figure 16:
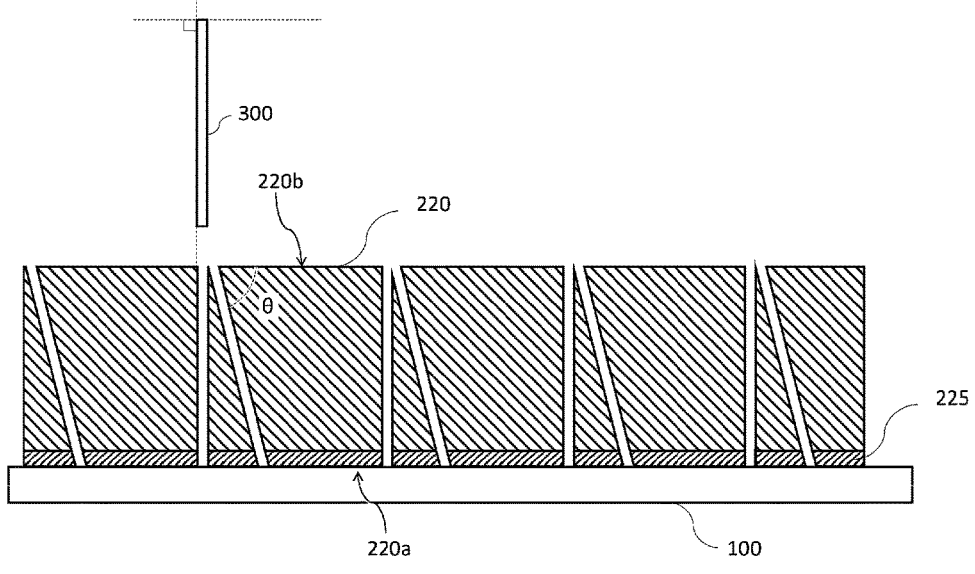
FIG. 16 is a process diagram illustrating a method for manufacturing a spacer according to the third embodiment.

A method for manufacturing the spacer 220 according to this embodiment will be described with reference to FIGS. 3, 4 and 16. The steps of FIGS. 3 and 4 are the same as in the first embodiment. Following the step of FIG. 4, the spacer 200 is diced without tilting the blade 300 (angle α=0°) as shown in FIG. 16, thereby completing manufacturing of spacers 220. The order of the steps of FIGS. 4 and 16 may be reversed: the step of FIG. 4 may be performed after the step of FIG. 16.

According to this embodiment, the spacer 220 has a trapezoidal shape when viewed in the Y direction, with the third surface 220*c* being inclined. Thus, as with the first embodiment, it is possible to enhance the degree of freedom of arrangement on the substrate 10, reduce the thickness of the semiconductor device 1, and increase the filling rate of the sealing resin 70.

In particular, by making the first surface 220*a* of the spacer 220 smaller than the second surface 220*b*, the spacer 220 can easily avoid contact with a first member provided beside the third surface 220*c*. Thus, the margin between the spacer 220 and the resin 35 as viewed in the Z direction can be reduced. Therefore, the degree of freedom of arrangement on the substrate 10 can be enhanced. For example, when the thickness of the spacer 220 is 50 μm and the inclination angle α of the blade 300 is 15 degrees (the angle θ between the third surface 220*c* and the second surface 220*b* is 75 degrees), the first surface 220*a* can be made smaller by about 13.4 um than the second surface 220*b*.

Fourth Embodiment

Figure 17:
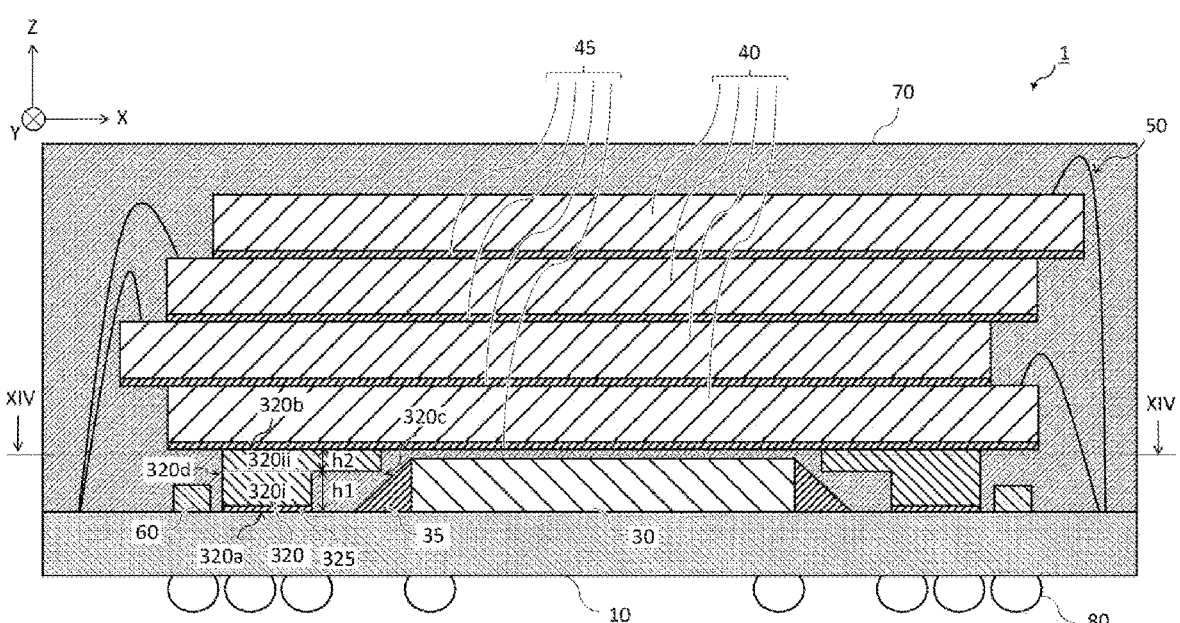
FIG. 17 is a cross-sectional view of a semiconductor device according to a fourth embodiment taken along line XVII-XVII of FIG. 14.
Figure 17:
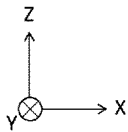

A fourth embodiment differs from the first embodiment in the shape of the spacer 20 as viewed in the Y direction. The configuration of a semiconductor device 1 according to this embodiment will be described with reference to FIG. 17. In this embodiment, the semiconductor device 1 includes spacers 320 instead of the spacers 20. The basic configuration of each spacer 320 is the same as that of the spacer 20. However, the spacer 320 includes an adhesive layer 325 instead of the adhesive layer 25. Further, the spacer 320 includes a first surface 320*a*, a second surface 320*b*, a third surface 320*c* and a fourth surface 320*d* instead of the first surface 20*a*, the second surface 20*b*, the third surface 20*c* and the fourth surface 20*d*. In this embodiment, the angle between the third surface 320*c* and the first surface 320*a* is approximately 90 degrees. The angle between the third surface 320*c* and the second surface 320*b* is approximately 90 degrees. The angle between the fourth surface 320*d* and the first surface 320*a* is approximately 90 degrees. The angle between the fourth surface 320*d* and the second surface 320*b* is approximately 90 degrees.

The spacer 320 includes a first portion 320*i* and a second portion 320*ii*. The first portion 320*i* is located on the substrate 10 side in the Z direction. The X-direction length of the first portion 320*i* is equal to the X-direction length of the first surface 320*a*. The second portion 320*ii* is located on the first portion 320*i*. The X-direction length of the second portion 320*ii* is equal to the X-direction length of the second surface 320*b*. Therefore, the X-direction length of the first portion 320*i* is shorter than the X-direction length of the second portion 320*ii*. In the X direction, the distance between the controller 30 and the farthest side of the first portion 320*i* from the controller 30 is approximately equal to the distance between the controller 30 and the farthest side of the second portion 320*ii* from the controller 30. Therefore, the spacer 320 is L-shaped when viewed in the Y direction. In other words, the third surface 320*c* has a stepped portion. The thickness h1 of the first portion 320*i* is larger than the thickness h2 of the second portion 320*ii* (h1>h2). Since the thickness h1 of the first portion 320*i* is larger than the thickness h2 of the second portion 320*ii*, the spacer 320 can more easily avoid contact with the resin 35. In this embodiment, the ratio between the thickness h1 of the first portion 320*i* and the thickness h2 of the second portion 320*ii* is, for example, 2:1.

At least part of the resin 35 is provided between the substrate 10 and the spacer 320 in the Z direction. Thus, at least part of the resin 35 overlaps the spacer 320 when viewed in the Z direction.

Figure 18:
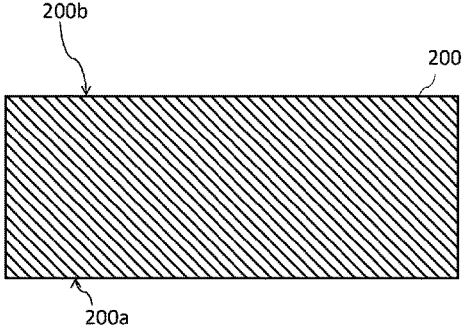
FIG. 18 is a process diagram illustrating a method for manufacturing a spacer according to the fourth embodiment.
Figure 19:
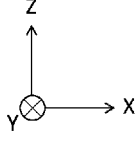
FIG. 19 is a process diagram illustrating the method for manufacturing the spacer according to the fourth embodiment.
Figure 19:
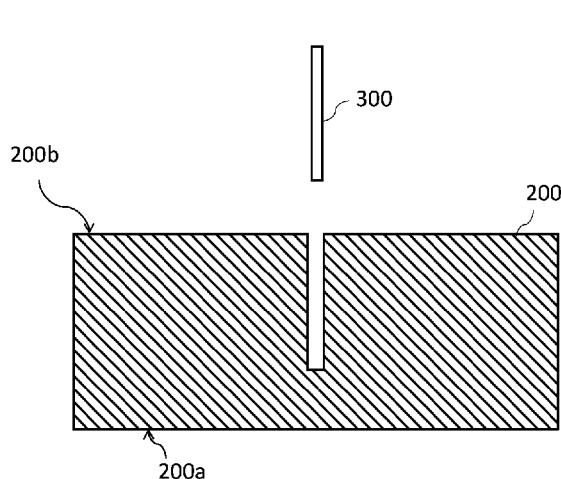

Two methods for manufacturing the spacer 320 according to this embodiment will be described with reference to FIGS. 18 through 27. At the outset, the first manufacturing method of the spacer 320 according to this embodiment will be described with reference to FIGS. 18 through 24. As shown in FIG. 18, a spacer 200 is set such that the main surface 200*a* is positioned on the negative side in the Z direction. As shown in FIG. 19, the spacer 200 is diced a predetermined thickness by a dicing blade 300 from the back surface 200*b*.

Figure 20:
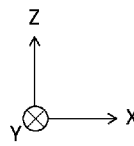
FIG. 20 is a process diagram illustrating the method for manufacturing the spacer according to the fourth embodiment.
Figure 20:
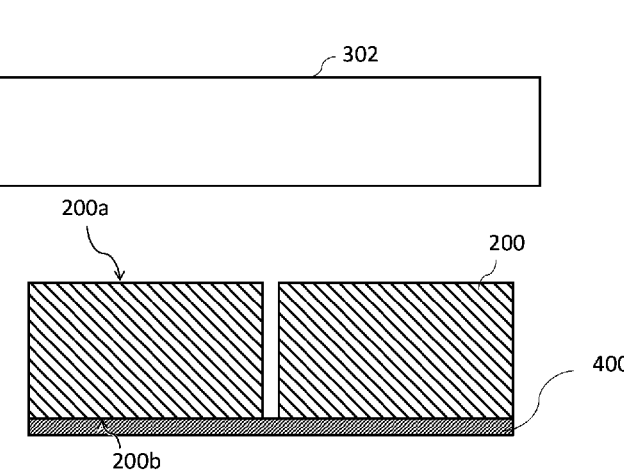
Figure 21:
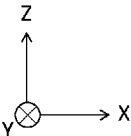
FIG. 21 is a process diagram illustrating the method for manufacturing the spacer according to the fourth embodiment.
Figure 21:
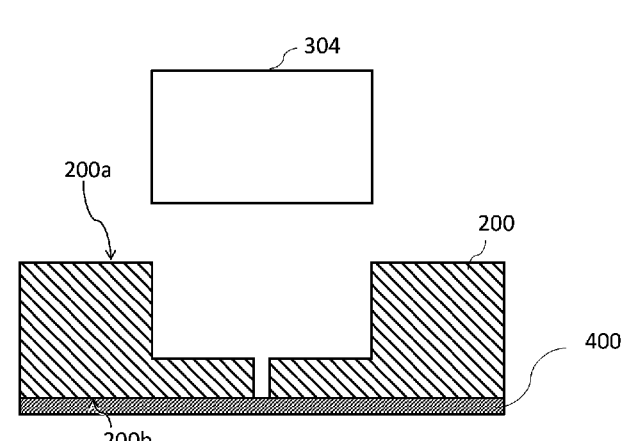

Subsequently, a protective tape 400 is provided on the back surface 200*b*. The main surface 200*a* and the back surface 200*b* of the spacer 200 with the protective tape 400 are reversed in the Z direction. As shown in FIG. 20, the main surface 200*a* of the spacer 200 is ground by a wheel 302. A thickness of the spacer 200 grounded by the wheel 302 is at least partially overlaps the portion that has been diced in the step of FIG. 19. As shown in FIG. 21, using a dicing blade 304 having a larger X-direction width than the dicing blade 300, the spacer 200 is diced from the main surface 200*a* to a thickness of about one-third of the thickness of the undiced portion of the spacer 200. Referring to FIG. 21, the dicing amount or thickness is based on the ratio between the thickness h1 of the first portion 320*i* and the thickness h2 of the second portion 320*ii*.

Figure 22:
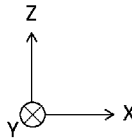
FIG. 22 is a process diagram illustrating the method for manufacturing the spacer according to the fourth embodiment.
Figure 22:
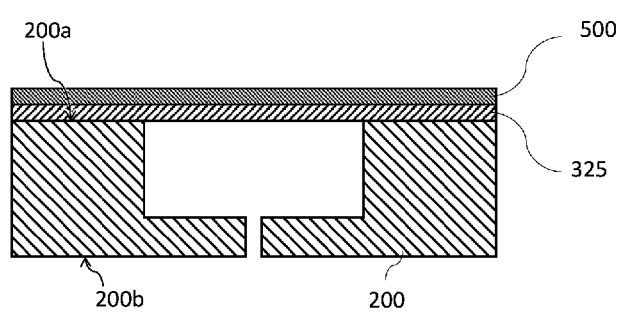
Figure 23:
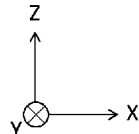
FIG. 23 is a process diagram illustrating the method for manufacturing the spacer according to the fourth embodiment.
Figure 23:
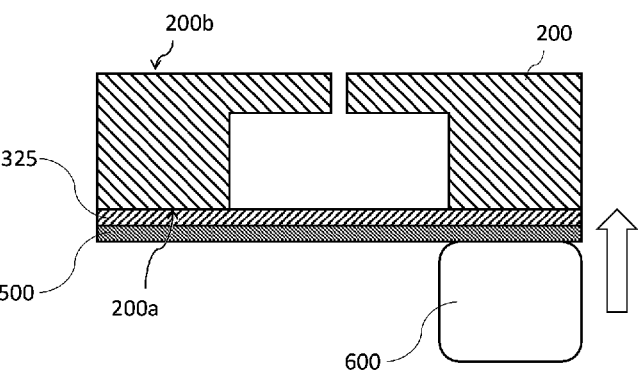
Figure 24:
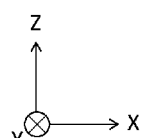
FIG. 24 is a process diagram illustrating the method for manufacturing the spacer according to the fourth embodiment.
Figure 24:
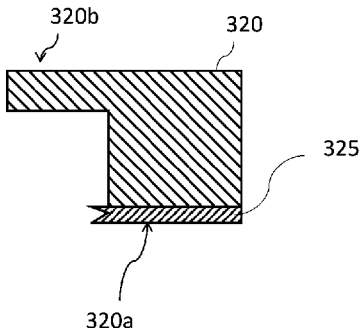

As shown in FIG. 22, the protective tape 400 is removed, and an adhesive layer 325 and a dicing tape 500 are sequentially provided on the main surface 200*a* of the spacer 200. The spacer 200, to which the adhesive layer 325 and the dicing tape 500 have been attached, is reversed in the Z direction. Subsequently, as shown in FIG. 23, the spacer 200, together with the adhesive layer 325 and the dicing tape 500, is thrust up by a pickup device 600 from the side of the dicing tape 500 to separate the spacer 200 into pieces, thereby completing manufacturing of a spacer 320 including the adhesive layer 325 as shown in FIG. 24. Since the spacer 200 is separated into pieces by thrusting up the dicing tape 500 and the adhesive layer 325 with the pickup device 600 in the first manufacturing method, the adhesive layer 325 of the spacer 320 has a non-smooth cut surface.

Figure 25:
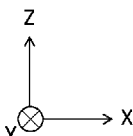
FIG. 25 is a process diagram illustrating another method for manufacturing the spacer according to the fourth embodiment.
Figure 25:
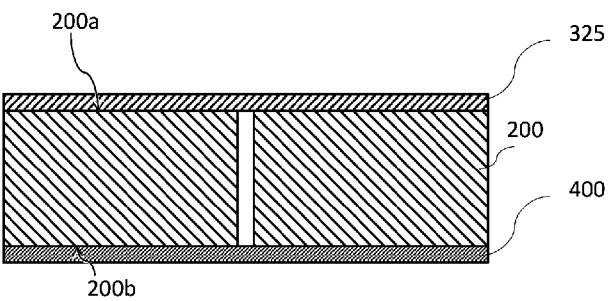
Figure 26:
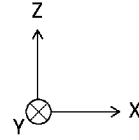
FIG. 26 is a process diagram illustrating the other method for manufacturing the spacer according to the fourth embodiment.
Figure 26:
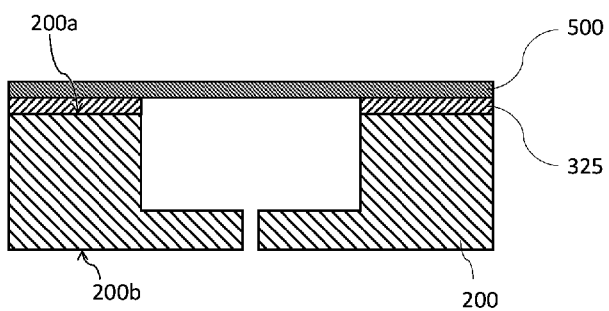
Figure 27:
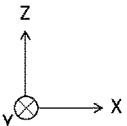
FIG. 27 is a process diagram illustrating the other method for manufacturing the spacer according to the fourth embodiment.
Figure 27:
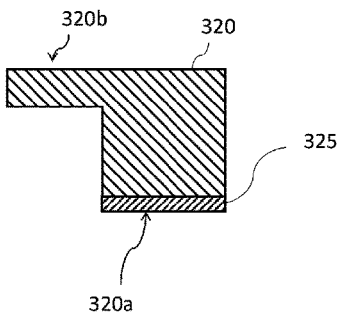

The second method for manufacturing the spacer 320 according to this embodiment will now be described with reference to FIGS. 25 through 27. The second method is the same as the first method in the steps described above with reference to FIGS. 18 through 20. As shown in FIG. 25, an adhesive layer 325 is provided on the main surface 200*a* of the spacer 200. Subsequently, using a not-shown dicing blade 304, the spacer 200 and the adhesive layer 325 are diced from the side of the main surface 200a to a thickness of about one-third of the thickness of the undiced portion of the spacer 200. Thereafter, as shown in FIG. 26, a dicing tape 500 is provided on the adhesive layer 325, while the protective tape 400 on the back surface 200b is removed. The timing for removing the protective tape 400 from the back surface 200b may be before attaching the dicing tape 500 to the adhesive layer 325.

Subsequently, the main surface 200a and the back surface 200b of the spacer 200 are reversed in the Z direction. The spacer 200 is thrust up by a not-shown pickup device 600 from the side of the dicing tape 500 to separate the spacer 200 into pieces, thereby completing manufacturing of a spacer 320 including the adhesive layer 325 as shown in FIG. 27. Since the adhesive layer 325 is diced by the dicing blade 304 in the second manufacturing method, the adhesive layer 325 of the spacer 320 has a smoother cut surface as compared to the spacer 320 obtained by the first manufacturing method.

According to this embodiment, the first portion 320i is smaller than the second portion 320ii, and the third surface 320c has a stepped shape when viewed in the Y direction. The spacer 320 according to this embodiment can therefore achieve the same effects as the spacer 220 according to the third embodiment. In the method of manufacturing the spacer 320 according to this embodiment, there is no need to tilt the blades 300, 304. Thus, the spacer 320 can be manufactured even if the blades 300, 304 are non-tiltable ones.

(Modification 1)

Figure 28:
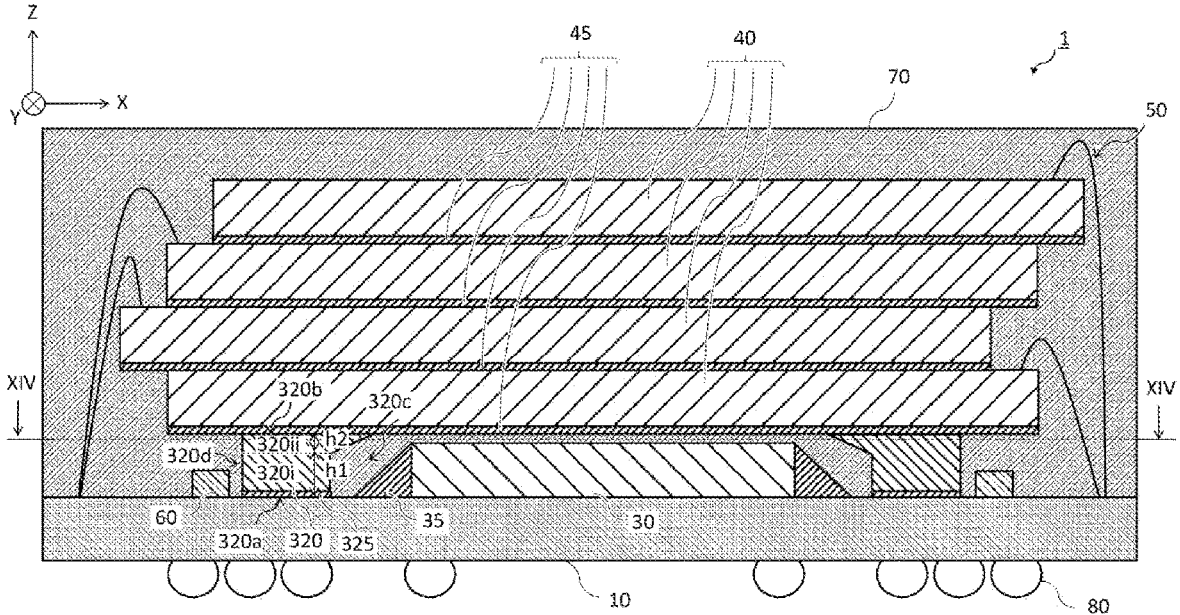
FIG. 28 is a cross-sectional view of the semiconductor device according to modification 1 of the fourth embodiment taken along line XXVIII-XXVIII of FIG. 14.

Modification 1 of the fourth embodiment will be described with reference to FIG. 28. In modification 1, the angle between the third surface 320c and the second surface 320b of the second portion 320ii is more than 0 degrees and less than 90 degrees. Thus, the third surface 320c at least partly includes an inclined surface.

The spacer 320 according to modification 1 is manufactured using, for example, a 3D printer. A usable manufacturing method is not limited to the use of such a printer; the spacer 320 may be manufactured by casting a material for the spacer 320 into a mold.

(Modification 2)

Figure 29:
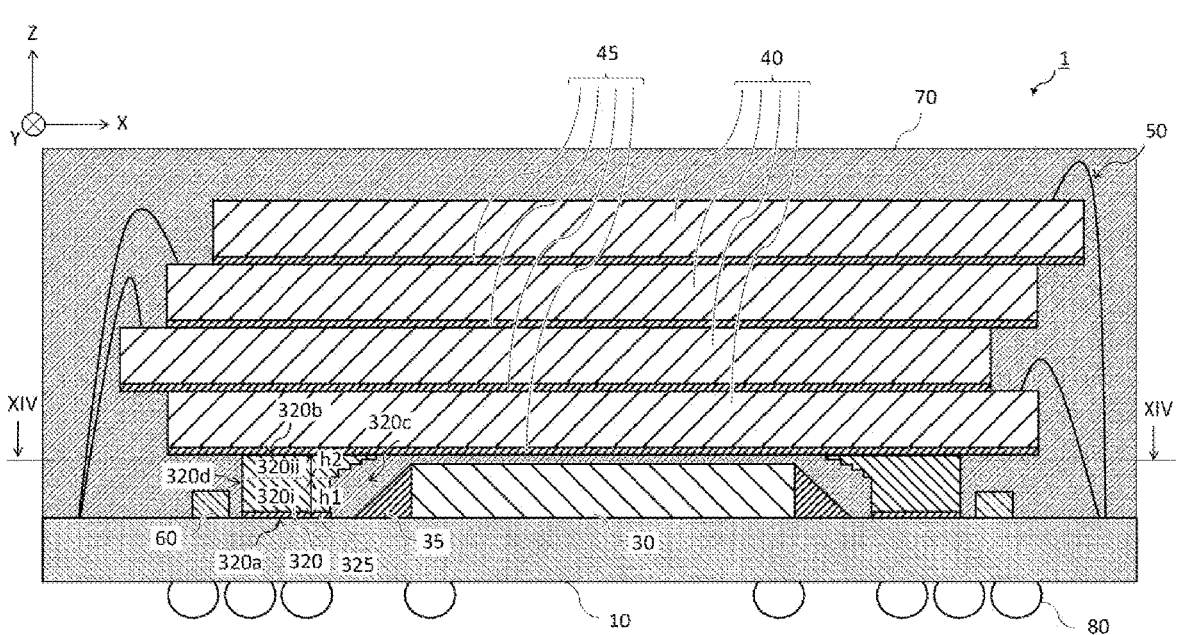
FIG. 29 is a cross-sectional view of the semiconductor device according to modification 2 of the fourth embodiment taken along line XXIX-XXIX of FIG. 14.

Modification 2 of the fourth embodiment will be described with reference to FIG. 29. In modification 2, the third surface 320c of the second portion 320ii has steps when viewed in the Y direction.

Figure 30:
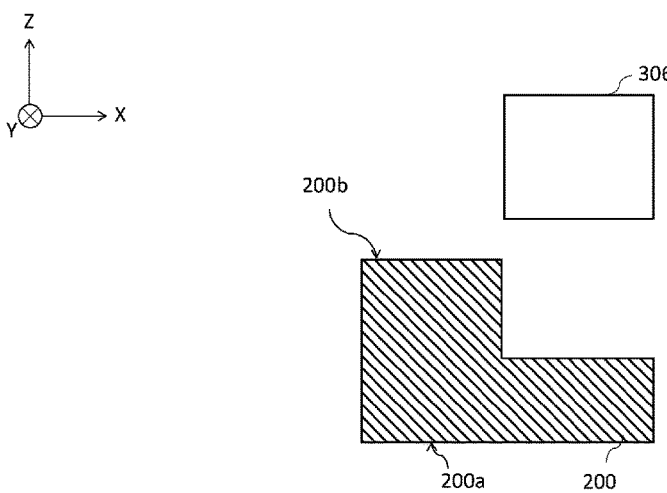
FIG. 30 is a process diagram illustrating a method for manufacturing a spacer according to modification 2 of the fourth embodiment.
Figure 31:
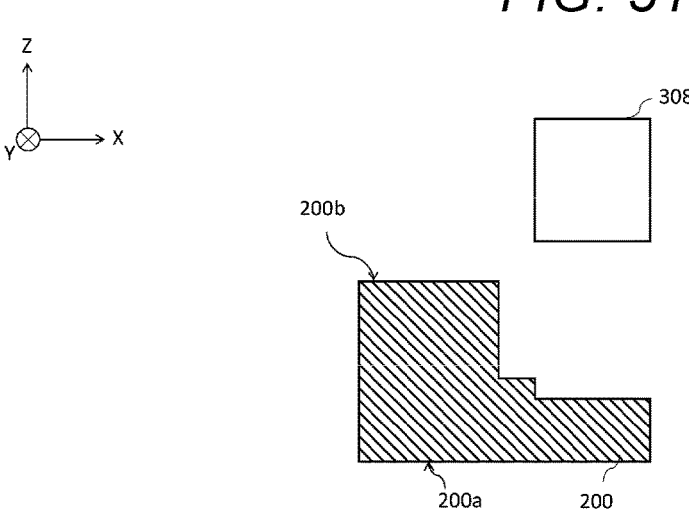
FIG. 31 is a process diagram illustrating the method for manufacturing the spacer according to modification 2 of the fourth embodiment.

A method for manufacturing the spacer 320 according to modification 2 will be described with reference to FIGS. 30 and 31. As in the fourth embodiment, a spacer 200 is set as shown in FIG. 18. As shown in FIG. 30, the spacer 200 is diced by using a dicing blade 306. Subsequently, as shown in FIG. 31, the spacer 200 is diced by using a dicing blade 308 whose width in the X direction is smaller than that of the dicing blade 306. The overall dicing thickness is larger than that in the dicing step shown in FIG. 30. Such a dicing operation is performed repeatedly while stepwise increasing the overall dicing thickness and decreasing the X-direction width of a dicing blade as the number of dicing operations increases, thereby manufacturing the spacer 320 shown in FIG. 29. A method for manufacturing the spacer 320 is not limited to the method illustrated in FIGS. 30 and 31. For example, a method may be used which uses the same dicing blade throughout the process and involves performing a dicing operation repeatedly while stepwise changing the overall dicing thickness and changing the X-direction dicing position. Alternatively, it is possible to use a method which involves stacking a plurality of spacers having different X-direction lengths to form the second portion 320ii. The spacer 320 according to modification 2 may also be manufactured by the same method as described above with reference to modification 1.

Fifth Embodiment

Figure 32:
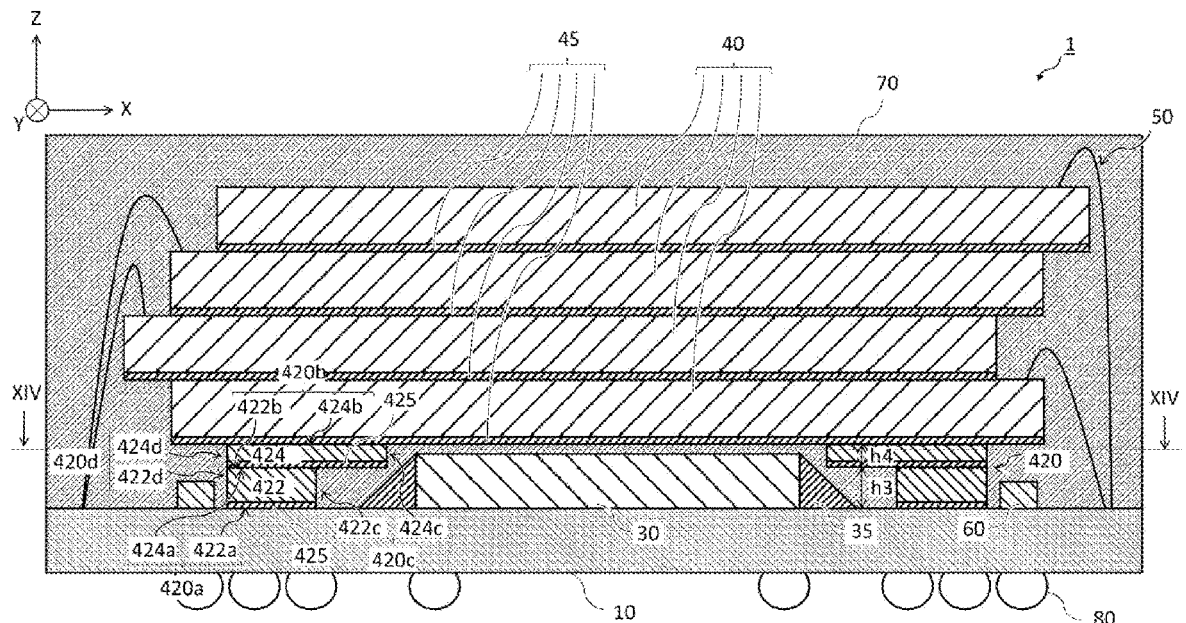
FIG. 32 is a cross-sectional view of a semiconductor device according to a fifth embodiment taken along line XXXII-XXXII of FIG. 14.

A fifth embodiment differs from the first embodiment in the structure of the spacer 20. In particular, the spacer according to the fifth embodiment comprises a plurality of spacers with different areas. The configuration of a semiconductor device 1 according to this embodiment will be described with reference to FIG. 32. In this embodiment, the semiconductor device 1 includes spacers 420 instead of the spacers 20. The basic configuration of each spacer 420 is the same as that of the spacer 20. However, the spacer 420 includes a first surface 420a, a second surface 420b, a third surface 420c and a fourth surface 420d instead of the first surface 20a, the second surface 20b, the third surface 20c and the fourth surface 20d.

In this embodiment, each spacer 420 comprises a first spacer 422 and a second spacer 424. The area of the second spacer 424 is larger than the area of the first spacer 422. The basic configuration of each of the first spacer 422 and the second spacer 424 is the same as that of the spacer 20. However, the first spacer 422 and the second spacer 424 each include an adhesive layer 425 instead of the adhesive layer 25. Further, the first spacer 422 has a first surface 422a, a second surface 422b, a third surface 422c and a fourth surface 422d instead of the first surface 20a, the second surface 20b, the third surface 20c and the fourth surface 20d. The second spacer 424 has a first surface 424a, a second surface 424b, a third surface 424c and a fourth surface 424d instead of the first surface 20a, the second surface 20b, the third surface 20c and the fourth surface 20d.

In this embodiment, the first surface 420a includes the first surface 422a and the first surface 424a. The second surface 420b includes the second surface 422b and the second surface 424b. The third surface 420c includes the third surface 422c and the third surface 424c. The fourth surface 420d includes the fourth surface 422d and the fourth surface 424d. In this embodiment, the third surface 422c and the third surface 424c form an angle of approximately 90 degrees with respect to the first surface 420a and the second surface 420b. The fourth surface 422d and the fourth surface 424d form an angle of approximately 90 degrees with respect to the first surface 420a and the second surface 420b.

In this embodiment, the second spacer 424 is provided above the first spacer 422. The thickness h3 of the first spacer 422 is larger than the thickness h4 of the second spacer 424 (h3>h4). In this embodiment, the ratio between the thickness h3 of the first spacer 422 and the thickness h4 of the second spacer 424 is, for example, 2:1. In the X direction, the distance between the controller 30 and the farthest side of the first spacer 422 from the controller 30 is approximately equal to the distance between the controller 30 and the farthest side of the second spacer 424 from the controller 30. Though in this embodiment the spacer 420 comprises two spacers, the first spacer 422 and the second spacer 424, the spacer 420 may comprise three or more spacers. When the spacer 420 comprises three or more spacers, at least two spacers have different areas. One(s) of the at least two spacers, which is farther from the substrate 10 in the Z direction, has a larger area.

At least part of the resin 35 is provided between the substrate 10 and the spacer 420 in the Z direction. Thus, at least part of the resin 35 overlaps the spacer 420 when viewed in the Z direction.

Figure 33:
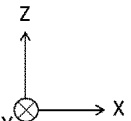
FIG. 33 is a process diagram illustrating a method for manufacturing the semiconductor device according to the fifth embodiment.
Figure 33:
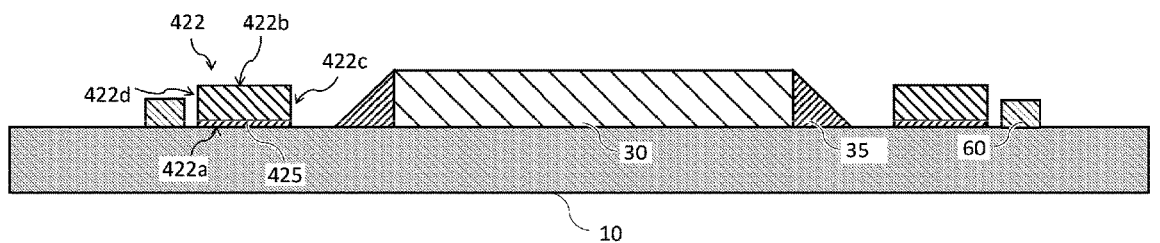
Figure 34:
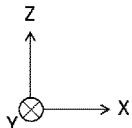
FIG. 34 is a process diagram illustrating the method for manufacturing the semiconductor device according to the fifth embodiment.
Figure 34:
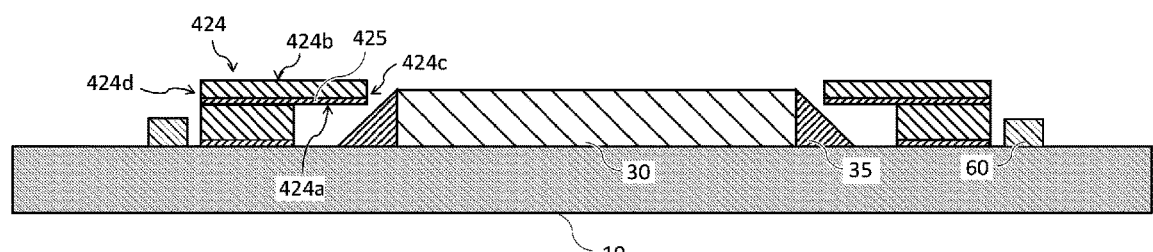

A method for manufacturing the semiconductor device 1 according to this embodiment will now be described with reference to FIGS. 33 and 34. As shown in FIG. 6, a controller 30 and components 60 are provided on a substrate 10. The controller 30 is fixed to the substrate 10 by a resin 35. Subsequently, as shown in FIG. 33, first spacers 422 are provided on the substrate 10. For example, an adhesive layer 425 on the first surface 422a is pressed against the substrate 10 to bond the first spacer 422 and the substrate 10 together. As shown in FIG. 34, a second spacer 424 is provided on each first spacer 422. For example, an adhesive layer 425 on the first surface 424a is pressed against the first spacer 422 to bond the second spacer 424 and the first spacer 422 together. Thereafter, the same process steps as described above with reference to FIGS. 8 and 9 are preformed, thereby completing manufacturing of the semiconductor device 1 according to this embodiment.

According to this embodiment, the spacer 420 comprises the first spacer 422 and the second spacer 424 provided above the first spacer 422 and having a larger area than the first spacer 422. Therefore, the spacer 420 according to this embodiment can achieve the same effects as the spacer according to the third embodiment. Further, there is no need to tilt the blade 300 in manufacturing the first spacer 422 and the second spacer 424 according to this embodiment. These spacers can each be manufactured in substantially the same manner. In addition, unlike the fourth embodiment, there is no need to use different types of blades such as the blades 300 and 304. This can reduce the number of process steps.

(Modification)

Figure 35:
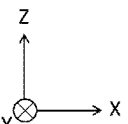
FIG. 35 is a cross-sectional view of the substrate of a semiconductor device according to a modification of the fifth embodiment.
Figure 35:
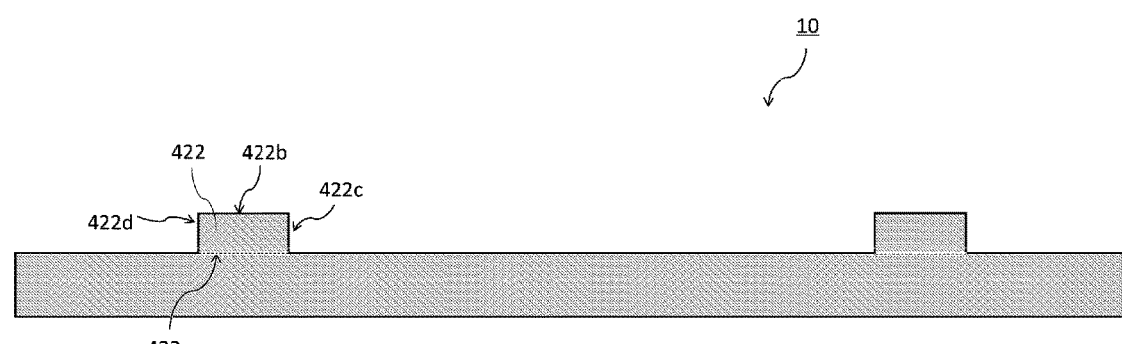

A modification of the fifth embodiment will be described with reference to FIG. 35. In the modification, the substrate 10 includes spacers of at least one type. In particular, the substrate 10 includes the first spacers 422. Thus, the first spacers 422 constitute part of the substrate 10. Accordingly, the spacers 420 each comprise a part of the substrate 10 and the second spacer 424. The first spacers 422 are made of, for example, the same material as the substrate 10. As long as the first spacers 422 constitute part of the substrate 10, they may be made of a material different from that of the other part of the substrate 10.

Sixth Embodiment

Figure 36:
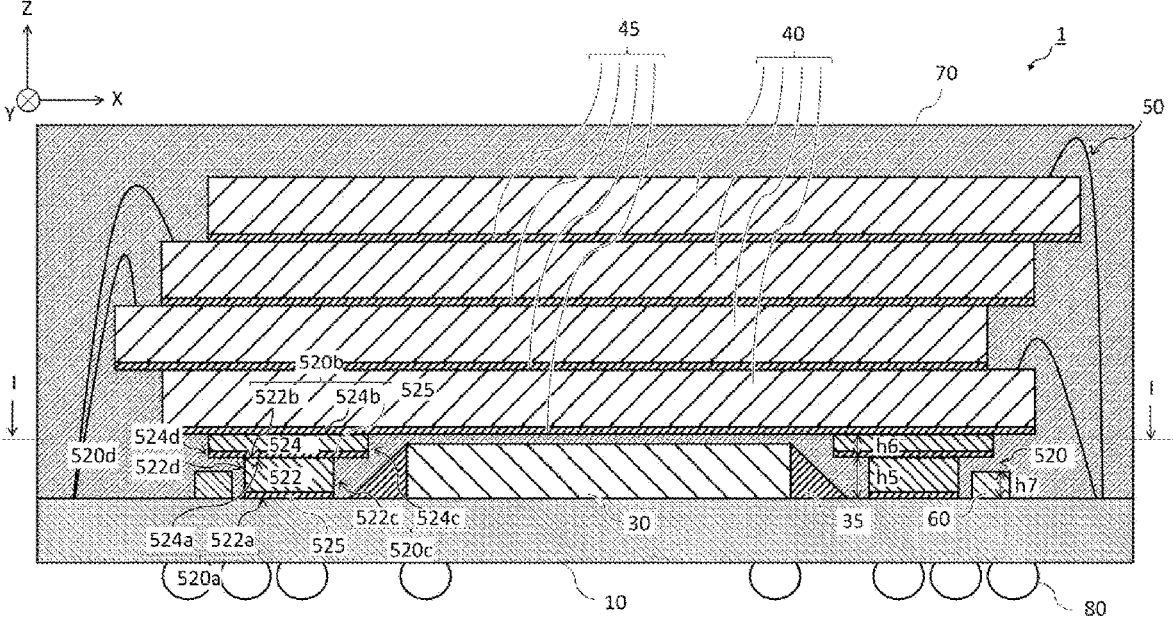
FIG. 36 is a cross-sectional view of a semiconductor device according to a modification of a sixth embodiment taken along line XXXVI-XXXVI of FIG. 1.

A sixth embodiment differs from the first embodiment in the structure of the spacer. In particular, the spacer according to the sixth embodiment comprises a plurality of spacers with different areas. The configuration of a semiconductor device 1 according to this embodiment will be described with reference to FIG. 36. In this embodiment, the semiconductor device 1 includes spacers 520 instead of the spacers 20. The basic configuration of each spacer 520 is the same as that of the spacer 20. However, the spacer 520 includes a first surface 520a, a second surface 520b, a third surface 520c and a fourth surface 520d instead of the first surface 20a, the second surface 20b, the third surface 20c and the fourth surface 20d.

In this embodiment, each spacer 520 comprises a first spacer 522 and a second spacer 524. The area of the second spacer 524 is larger than the area of the first spacer 522. The basic configuration of each of the first spacer 522 and the second spacer 524 is the same as that of the spacer 20. However, the first spacer 522 and the second spacer 524 each include an adhesive layer 525 instead of the adhesive layer 25. Further, the first spacer 522 has a first surface 522a, a second surface 522b, a third surface 522c and a fourth surface 522d instead of the first surface 20a, the second surface 20b, the third surface 20c and the fourth surface 20d. The second spacer 524 has a first surface 524a, a second surface 524b, a third surface 524c and a fourth surface 524d instead of the first surface 20a, the second surface 20b, the third surface 20c and the fourth surface 20d.

In this embodiment, the first surface 520a includes the first surface 522a and the first surface 524a. The second surface 520b includes the second surface 522b and the second surface 524b. The third surface 520c includes the third surface 522c and the third surface 524c. The fourth surface 520d includes the fourth surface 522d and the fourth surface 524d. In this embodiment, the third surface 522c and the third surface 524c form an angle of approximately 90 degrees with respect to the first surface 520a and the second surface 520b. The fourth surface 522d and the fourth surface 524d form an angle of approximately 90 degrees with respect to the first surface 520a and the second surface 520b.

In this embodiment, the second spacer 524 is provided above the first spacer 522. The thickness h5 of the first spacer 522 is larger than the thickness h6 of the second spacer 524 (h5>h6). The thickness h5 of the first spacer 522 is larger than the thickness h7 of the component 60 (h5>h7). In this embodiment, the ratio between the thickness h5 of the first spacer 522 and the thickness h6 of the second spacer 524 is, for example, 2:1. In the X direction, the distance between the controller 30 and the farthest side of the first spacer 522 from the controller 30 is shorter than the distance between the controller 30 and the farthest side of the second spacer 524 from the controller 30. In the X direction, the distance between the controller 30 and the nearest side of the first spacer 522 from the controller 30 is longer than the distance between the controller 30 and the nearest side of the second spacer 524 from the controller 30. Therefore, the spacer 520 is T-shaped when viewed in the Y direction. However, the shape of the spacer 520 as viewed in the Y direction is not limited to T-shape as long as the X-direction length of the second spacer 524 on either side is longer than that of the first spacer 522.

Though in this embodiment the spacer 520 comprises two spacers, the first spacer 522 and the second spacer 524, the spacer 520 may comprise three or more spacers. When the spacer 520 comprises three or more spacers, at least two spacers have different areas. One(s) of the at least two spacers, which is farther from the substrate 10 in the Z direction, has a larger area. When viewed in the Y direction, one(s) of the at least two spacers, which is farther from the substrate 10, has a longer X-direction length on either side than the spacer near to the substrate 10.

In this embodiment, at least part of the first member(s) is provided between the substrate 10 and the spacer 520 in the Z direction. Thus, at least part of the resin 35 and at least part of the component 60 overlap the spacer 520 when viewed in the Z direction.

The semiconductor device 1 according to this embodiment can be manufactured by the same method as described above with reference to the fifth embodiment.

The spacer 520 according to this embodiment is shaped such that when viewed in the Y direction, the X-direction length of the second spacer 524 on either side is longer than that of the first spacer 522. Such a spacer can achieve the same effects as the spacer according to the first embodiment. Further, there is no need to tilt the blade 300 in manufacturing the first spacer 522 and the second spacer 524 according to this embodiment. These spacers can each be manufactured in substantially the same manner. In addition, unlike the fourth embodiment, there is no need to use different types of blades such as the blades 300 and 304. This can reduce the number of process steps.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
   a substrate;
   a spacer disposed on the substrate and having a first surface facing the substrate, a second surface opposite to the first surface, and a third surface, at least part of the third surface forming an angle of less than 90 degrees with respect to the second surface; and
   a first member disposed on the substrate and, when viewed in a first direction from the substrate toward the spacer, at least part of the first member overlaps the spacer, and the first member is not in contact with the spacer.

2. The semiconductor device according to claim 1, wherein the first surface is smaller than the second surface.

3. The semiconductor device according to claim 2, wherein the spacer has a trapezoidal shape when viewed in a second direction intersecting the first direction.

4. The semiconductor device according to claim 1, wherein the angle is 30 degrees or more and less than 90 degrees.

5. The semiconductor device according to claim 1, wherein the spacer has a parallelogram shape when viewed in a second direction intersecting the first direction.

6. The semiconductor device according to claim 1, further comprising a first semiconductor chip and a second semiconductor chip, wherein the first semiconductor chip is disposed on the substrate, the second semiconductor chip is disposed on the spacer, and a first resin is provided as the first member on the side of the first semiconductor chip.

7. The semiconductor device according to claim 1, wherein a semiconductor element or a substrate terminal is provided as the first member on a periphery of the spacer.

8. The semiconductor device according to claim 1, further comprising a second resin configured to seal the semiconductor device.

9. The semiconductor device according to claim 1, wherein the spacer includes a third resin, silicon, a ceramic, or a metal.

10. A semiconductor device comprising:
   a substrate;
   a spacer disposed above the substrate and having a first surface facing the substrate, a second surface opposite to the first surface and larger than the first surface, and a third surface extending in a first direction from the first surface toward the second surface; and
   a first member, at least part of the first member overlaps the spacer when viewed in the first direction, and wherein the first member is not in contact with the spacer.

11. The semiconductor device according to claim 10, wherein the spacer is L-shaped or T-shaped when viewed in a second direction intersecting the first direction.

12. The semiconductor device according to claim 10, wherein the spacer includes a first spacer disposed on the substrate, the first spacer having the first surface, and a second spacer disposed above the first spacer and the second spacer having the second surface.

13. The semiconductor device according to claim 12, wherein a thickness of the first spacer is larger than a thickness of the second spacer in the first direction.

14. The semiconductor device according to claim 12, wherein the third surface of the second spacer either has a step or forms an angle of less than 90 degrees with respect to the second surface.

15. The semiconductor device according to claim 10, wherein the first member is a capacitor, a metal wire, or a resin.

* * * * *